US006642787B1

(12) United States Patent
Souetinov et al.

(10) Patent No.: US 6,642,787 B1
(45) Date of Patent: *Nov. 4, 2003

(54) DIFFERENTIAL AMPLIFIER WITH TWO LONG-TAILED PAIRS OF TRANSISTORS

(75) Inventors: Viatcheslav Igor Souetinov; Peter Graham Laws, both of Swindon (GB)

(73) Assignee: Mitel Semiconductor Limited, Swindon (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/526,832

(22) Filed: Mar. 16, 2000

(30) Foreign Application Priority Data

Mar. 16, 1999 (GB) ............................................. 9906026

(51) Int. Cl.[7] ................................................ H03F 3/45
(52) U.S. Cl. ...................................... 330/252; 330/261
(58) Field of Search ................................. 330/252, 254, 330/261, 283

(56) References Cited

U.S. PATENT DOCUMENTS 4,267,516 A * 5/1981 Traa ........................ 330/252 X
4,369,410 A    1/1983 Fenk
4,381,487 A * 4/1983 Erickson ................. 330/252 X
4,634,995 A * 1/1987 Nakayawa et al. ......... 330/261
5,196,805 A    3/1993 Beckwith
5,465,072 A   11/1995 Atarodi

FOREIGN PATENT DOCUMENTS

EP    0 600 141 A1    6/1994
FR      2 462 817     2/1981
JP      59-44112   *  3/1984

* cited by examiner

*Primary Examiner*—Steven J. Mottola
(74) *Attorney, Agent, or Firm*—Kilpatrick Stockton LLP

(57) ABSTRACT

An amplifier circuit arrangement comprises first and second long-tailed pairs of transistors each including an inductor to provide a constant current source for their respective transistor pair. Each of the transistors of the pairs is provided with a bias current on its base electrode. A differential input signal is applied between the base electrode of one transistor, via a dc blocking capacitor and an input terminal, and the base electrode of another transistor, via a dc blocking capacitor and an another input terminal. The collector electrodes of two of the transistors are connected together and to an output terminal. The collector electrodes of the other two transistors similarly are connected together and to the other output terminal. A differential output signal is provided between the output terminals. This connection of the collectors of the transistors, which can be described as parallel connection, provides summation of the differential signals provided by the transistor pairs.

13 Claims, 3 Drawing Sheets

DIFFERENTIAL AMPLIFIER WITH TWO LONG-TAILED PAIRS OF TRANSISTORS

FIELD OF THE INVENTION

This invention relates to amplifier circuit arrangements. In particular, although not exclusively, this invention relates to amplifier circuit arrangements for implementation in mobile radio transceivers, such as radiotelephones.

BACKGROUND OF THE INVENTION

A radio transmitter tends to constitute more of a drain on a mobile transceiver's battery than any other component. There is a continuing drive to improve the linearity, output power and noise figure of these transmitters whilst operating from low voltage supplies (often less than 3 V) and with low current consumption, even at frequencies of the order of 2 GHz.

Where voltage headroom is a concern, it is usual to use either the common-emitter amplifier circuit of FIG. 1 or the long-tailed pair amplifier circuit of FIG. 2. In each case, the use of open collector outputs 10 allows the use of an external inductor (not shown) connected between supply voltage and the output or outputs 10 to provide current to the collector of the or each transistor 12. This can also enable the output signal swing to exceed the level of the voltage supply. The use of these external inductors and of current source inductors 11 provides the transistors 12 with a large proportion of the voltage supply, for use in providing the output signal.

Because the FIG. 1 circuit has a single-ended output, only a simple impedance matching circuit is required. The FIG. 2 differential output circuit allows higher maximum output power than the FIG. 1 circuit but requires a more complicated impedance matching circuit when loaded by a filter with a single-ended input.

There are two primary sources of non-linearity in these amplifier circuits: the non-linearity of a base-emitter junction and the non-linearity of a collector-base capacitance. The base-emitter junction non-linearity is often mitigated through the use of a resistor or an inductor connected in series with the emitter to provide emitter degeneration. The collector-base capacitance non-linearity is more difficult to mitigate. Since the scale of each of the output transistors 12 is high, the input impedance is relatively low and very non-linear. To improve linearity, the amplifier circuit would have to be driven by a signal source having a very low output impedance. However, this would cause relatively high current levels to be consumed, especially at high frequencies. Cascode circuits are not practical where reasonably high output power levels are required from a low- voltage power supply. Linearity is particularly important in CDMA transmitters.

SUMMARY OF THE INVENTION

According to this invention, there is provided an amplifier circuit arrangement comprising first and second long-tailed pairs of transistors, wherein a differential input signal is received between the base electrode of a first transistor of the first pair and the base electrode of a first transistor of the second pair, the base electrodes of second transistors of the said pairs are coupled together and to a source of bias, and the collector electrodes of the transistors of the pairs are cross-coupled to provide a differential output.

Preferably the source of bias is a high impedance source of bias.

The emitter electrodes of the transistors of each pair are preferably connected together by a respective inductor. This provides series degeneration for the input transistors which is noiseless and which does not impinge on the voltage supply. The Miller effect is also reduced and, because the input impedance of the transistors is real, impedance matching is made easier. The inductors are preferably mutually coupled. This allows space saving on the chip on which the arrangement is provided, and provides improved symmetry in the differential output.

A capacitor may be connected between the base electrode of the first transistor and the collector electrode of the second transistor of each pair. This feature improves the linearity characteristics.

According to a second aspect of this invention, there is provided an amplifier circuit arrangement comprising first to fourth transistors each having base, collector and emitter electrodes, wherein a differential input signal is received between the base electrodes of the first and fourth transistors, the base electrodes of the second and third transistors are connected together and to a source of bias, the emitter electrodes of the first and second transistors are connected to form a long tailed pair, the emitter electrodes of the third and fourth transistors are connected to form a long tailed pair, the collector electrodes of the first and third transistors are connected together and to a first side of a differential output, and the emitter electrodes of the second and fourth electrodes are connected together and to a second side of the differential output.

Preferably the source of bias is a high impedance source of bias.

In accordance with another aspect of the invention, there is provided a method of amplifying a differential input signal, comprising applying the signal between two long-tailed pairs of transistors, one of which is connected to one of the input lines and the other of which is connected to the other of the input lines, each long-tailed pair generating a respective differential output signal, biasing the commonly-coupled base electrodes of the two transistors which are not connected to receive the input signal directly from a high impedance source, and combining the two differential output signals to form a combined differential output signal.

Embodiments of this invention will now be described, by way of example, with reference to the accompanying drawings.

DETAILED DESCRIPTION OF THE PREFERRED EMBODIMENTS

Figure 3:
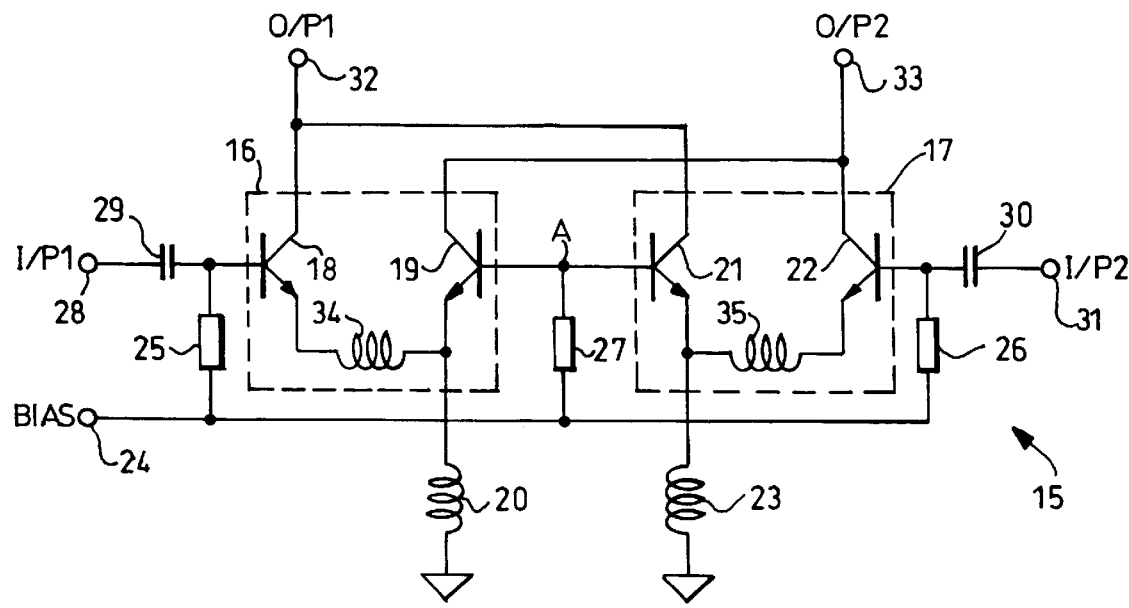
FIG. 3 is a circuit diagram of an amplifier circuit arrangement in accordance with this invention.

Referring to FIG. 3, an amplifier circuit arrangement 15 comprises first and second long-tailed pairs of transistors 16 and 17. These are formed from transistors 18 and 19 and an inductor 20 and from transistors 21 and 22 and an inductor 23 respectively. The inductors 20 and 23 are connected between ground potential and the emitter electrode of their respective transistor 19, 21. This provides a constant current source for their respective transistor pair 16 and 17. A bias voltage 24 is connected to the base electrode of the transistor 18 by a first resistor 25, to the base electrode of the transistor 22 by a second resistor 26 and to the commonly connected electrodes of the transistors 19 and 21 by a third resistor 27. Each of the transistors 18, 19, 21 and 22 is thus provided with a bias current. The impedance of the source of bias which biases the transistors 19 and 21 is high, and is preferably at least five times the input impedance of the pairs of transistors.

A differential input signal is applied between the base electrode of the transistor 18, via a dc blocking capacitor 29 and an input terminal 28, and the base electrode of the transistor 22, via a dc blocking capacitor 30 and an input terminal 31. A differential output signal is provided between output terminals 32 and 33. The collector electrodes of the transistors 18 and 21 are connected together and to the output terminal 32. The collector electrodes of the transistors 19 and 22 similarly are connected together and to the output terminal 33. This connection of the collectors of the transistors, which can be described as parallel connection, provides summation of the differential signals provided by the transistor pairs 16 and 17.

Inductive degeneration for the input transistors 18 and 22 is provided by inductors 34 and 35, which are connected between the emitters of the transistors of the pairs 16 and 17 respectively.

The ac component of the base current of the transistor 19 is equal in magnitude but opposite in phase to the ac component of the base current of the transistor 21. Thus, a node A at the interconnection of these base electrodes can be considered to be a virtual ac ground.

Figure 1:
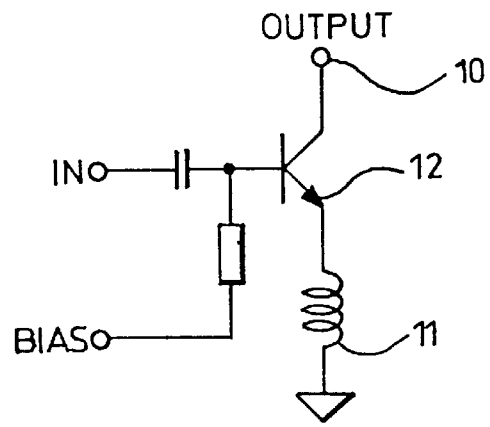
FIGS. 1 and 2 are circuit diagrams of prior art amplifier circuits.
Figure 2:
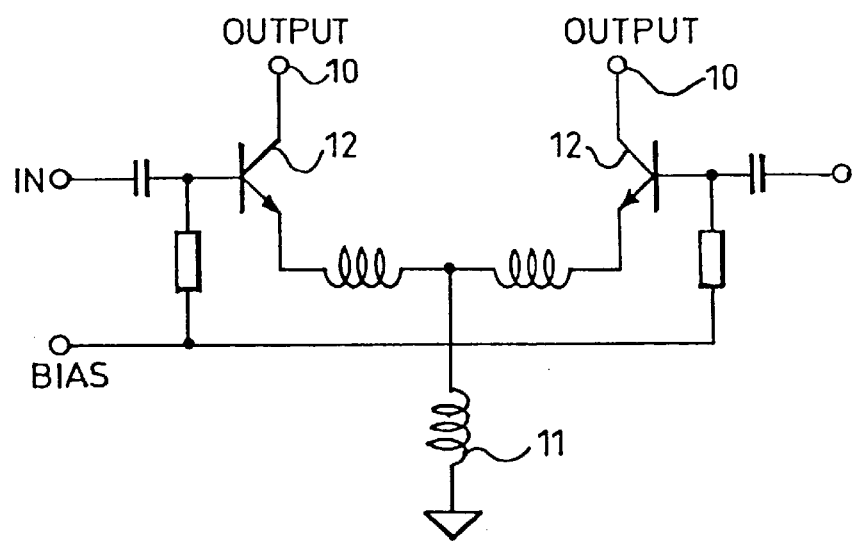

Because the transistors 18 and 22 are biased by only one quarter of the total bias current, their scale is equal to only one quarter of the total transistor scale. This results in improved linearity. Also, the input impedance of the transistors 18 and 22 is double the input impedance of the transistors 12 of FIG. 2. This allows the output impedance of the preceding stage to be increased and thus current consumption to be reduced. Furthermore, the output impedance of the amplifier circuit arrangement 15 is greater than that of the FIG. 2 arrangement because the transistors 19 and 21 are connected in a common-base configuration. This results in reduced loss at the output and in a further reduction in current consumption.

Figure 4:
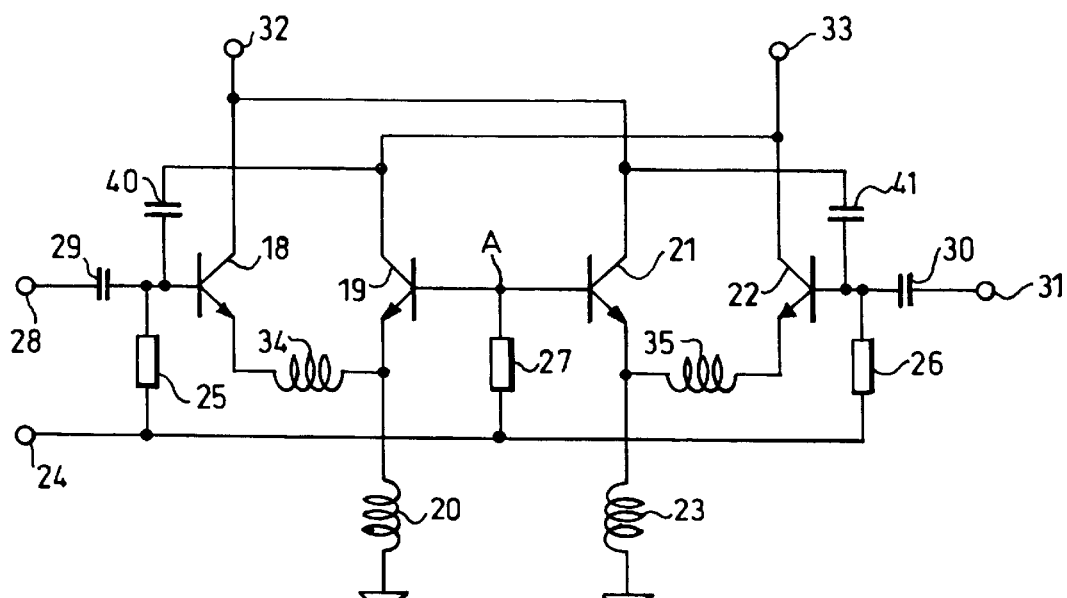
FIGS. 4 and 5 are circuit diagrams of alternative amplifier circuit arrangements in accordance with this invention.
Figure 5:
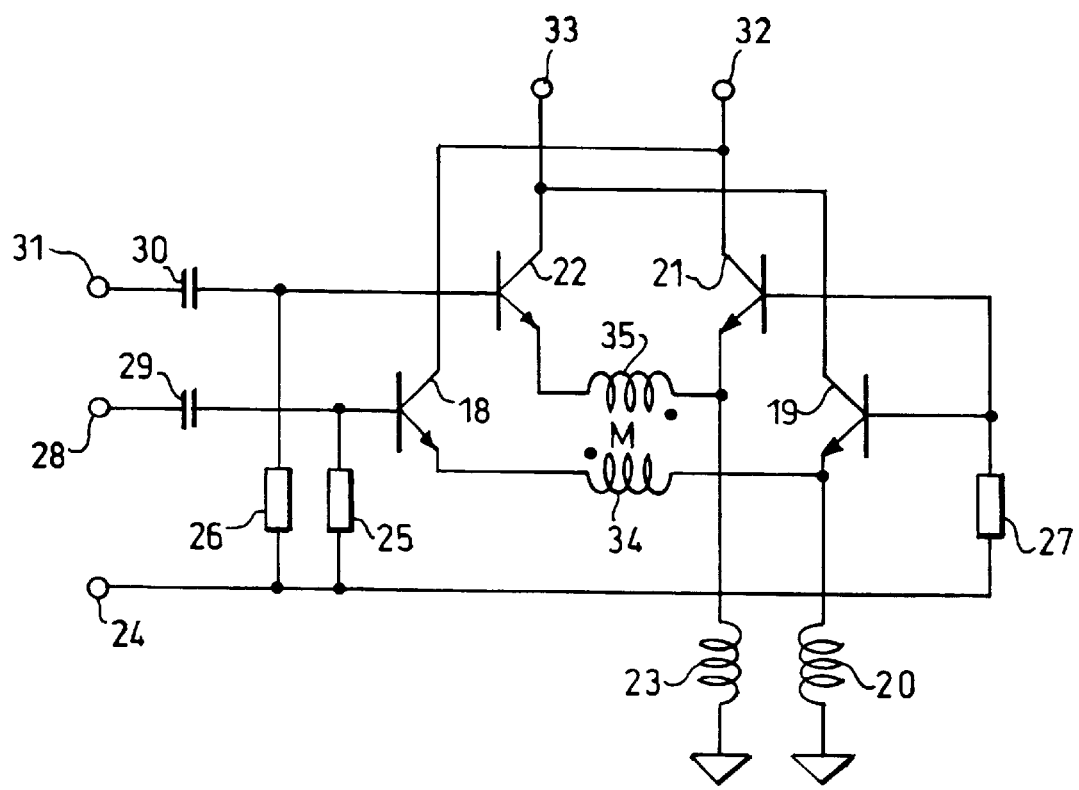

In the alternative embodiment shown in FIG. 4, the arrangement 15 is modified by the connection of a small value capacitor 40 between the base electrode of the transistor 18 and the collector electrode of the transistor 19 and by the connection of a small value capacitor 41 between the base electrode of the transistor 22 and the collector electrode of the transistor 21. Reference numerals have been retained from FIG. 3 for like elements. The capacitors 40 and 41 are, in effect, cross-coupled between the circuit inputs 28 and 31 and the circuit outputs 32 and 33.

The effect of the capacitors 40 and 41 is to compensate signal feed-through caused by the base-collector capacitance of the transistors 18 and 22. This results in further improvement in the linearity of the amplifier circuit arrangement. The effect is maximised by providing each of the capacitors 40 and 41 with a value equal to the base-collector capacitance of the transistors 18 and 22, although allowance may be made for the nature of the load (not shown) used with the arrangement 15. The capacitors 40 and 41 also effect some positive feedback in the arrangement, which increases slightly the gain.

The inductors 34 and 35, although not necessary, are preferred to resistors because there is no dc voltage drop across an inductor. This allows more of the voltage supply to be used in providing an output signal. Also, the input impedance of the transistors 18 and 22 is real rather than complex as a result of the connection of the inductors 34 and 35. Consequently, impedance matching with the preceding circuit stage more easily accomplished. Furthermore, the phase shift provided by the transistors 18 and 22 becomes approximately 90 degrees, which reduces the Miller effect.

The use of inductors for degeneration does have a disadvantage in that integrated inductors occupy a relatively large chip area. The extent of this can be reduced by forming the inductors 34 and 35 on a common land area as mutually coupled inductors. This is possible because the signals applied to one of the inductors is equal in magnitude but opposite in phase to the signal applied to the other one of the inductors. This mutual coupling also provides improvement in the symmetry of the differential output signal.

The inductors 20 and 23 do not need to be made on-chip. At high operating frequencies, it is preferred that package leadframe or bondwire parasitic inductors are used as the inductors 20 and 23. The primary requirement of the inductors 20 and 23 is that their effective impedance at the operating frequency is significantly higher than the emitter impedance of the transistors 19 and 21. This emitter impedance is usually very low.

In each embodiment, the pairs of transistors 16 and 17 each function as a differential amplifier. The cross-coupling of the outputs of the transistor pairs 16 and 17 to provide a single differential output allows each transistor to take a smaller share of the signal handling task than where fewer transistors are used. The high impedance bias source including the resistor 27 serves as a constant current source. The alternating current component of the base currents of the transistors the base electrodes of which are commonly coupled are equal in amplitude but opposite in phase. The output signal of each transistor pair 16 and 17 is balanced. The presence of bias resistor 27 and the inductors 20, 23 allow the transistors 19 and 21 to track in antiphase the current flowing in the opposite transistor 18, 22 in their respective pair 16, 17 as a result of the input signal received at the input terminals 28, 31.

What is claimed is:

1. An amplifier circuit arrangement comprising first and second long-tailed pairs of transistors, wherein a differential input signal is received between the base electrode of a first transistor of the first pair and the base electrode of a first transistor of the second pair, the base electrodes of second transistors of the said pairs are coupled together and to a source of bias having an impedance at least five times the input impedance of each of the second transistors, and the collector electrodes of the transistors of the pairs are cross-coupled to provide a differential output, wherein each long-tailed pair has an associated capacitor connected between the base electrode of the first transistor and the collector electrode of the second transistor.

2. An arrangement according to claim 1, in which the emitter electrodes of the transistors of each pair are connected together by a respective inductor.

3. An arrangement according to claim 2, in which the inductors are mutually coupled.

4. An arrangement according to claim 1, in which the first transistors are each connected to receive their respective input signal via a respective capacitor and each is connected to a respective high impedance source of bias.

5. An arrangement according to claim 1, including a respective current source for each long-tailed pair, the current source being connected to the emitter of the second transistor of its respective long-tailed pair.

6. An amplifier circuit arrangement comprising first and second long-tailed pairs of transistors, wherein a differential input signal is received between the base electrode of a first transistor of the first pair and the base electrode of a first transistor of the second pair, the base electrodes of second transistors of the said pairs are coupled together and to a high impedance source of bias, the collector electrodes of the transistors of the pairs are cross-coupled to provide a differential output, and wherein each long-tailed pair has an associated capacitor connected between the base electrode of the first transistor and the collector electrode of the second transistor.

7. An arrangement according to claim 6, in which the capacitors each have a value approximately equal to the base-emitter capacitance of each of the first transistors.

8. An amplifier circuit arrangement comprising first to fourth transistors each having base, collector and emitter electrodes, wherein a differential input signal is received between the base electrodes of the first and fourth transistors, the base electrodes of the second and third transistors are connected together and to a first source of bias having an impedance at least five times the input impedance of each of the second and third transistors, the emitter electrodes of the first and second transistors are connected to form a long-tailed pair, the emitter electrodes of the third and fourth transistors are connected to form a long-tailed pair, the collector electrodes of the first and third transistors are connected together and to a first side of a differential output, and the collector electrodes of the second and fourth transistors are connected together and to a second side of the differential output, the emitter electrodes of the first and second transistors being connected together by a first inductor and the emitter electrodes of the third and fourth transistors being connected together by a second conductor, the first and second inductors being mutually coupled on a common land area.

9. An amplifier arrangement comprising first to fourth transistors each having base, collector and emitter electrodes, wherein a differential input signal is received between the base electrodes of the first and fourth transistors, the base electrodes of the second and third transistors are connected together and to a first high impedance source of bias, the emitter electrodes of the first and second transistors are connected to form a long-tailed pair, the emitter electrodes of the third and fourth transistors are connected to form a long-tailed pair, the collector electrodes of the first and third transistors are connected together and to a first side of a differential output, the collector electrodes of the second and fourth transistors are connected together and to a second side of the differential output, the base electrode of the first transistor is connected to receive its respective part of the input signal via a first capacitor and is connected to a second high impedance source of bias, and the base electrode of the fourth transistor is connected to receive its respective part of the input signal via a second capacitor and is connected to a third high impedance source of bias.

10. An arrangement according to claim 8, in which the emitter electrode of the second transistor is connected to a first current source, and the emitter electrode of the third transistor is connected to a second current source.

11. An arrangement according to claim 12, in which the first and second current sources are formed from third and fourth inductors respectively.

12. An amplifier circuit arrangement comprising first to fourth transistors each having base, collector and emitter electrodes, wherein a differential input signal is received between the base electrodes of the first and fourth transistors, the base electrodes of the second and third transistors are connected together and to a first source of bias having an impedance at least five times the input impedance of each of the second and third transistors, the emitter electrodes of the first and second transistors are connected to form a long-tailed pair, the emitter electrodes of the third and fourth transistors are connected to form a long-tailed pair, the collector electrodes of the first and third transistors are connected together and to a first side of a differential output, and the collector electrodes of the second and fourth transistors are connected together and to a second side of the differential output, a third capacitor is connected between the base electrode of the first transistor and the collector electrode of the second transistor, and a fourth capacitor connected between the base electrode of the fourth transistor and the collector electrode of the third transistor.

13. An amplifier circuit arrangement according to claim 14, in which the third and fourth capacitors each have a value approximately equal to the base-emitter capacitance of each of the first and fourth transistors.

* * * * *